United States Patent
Kim et al.

(10) Patent No.: US 10,647,089 B2
(45) Date of Patent: *May 12, 2020

(54) CONDUCTIVE STRUCTURE AND ELECTRONIC DEVICE COMPRISING SAME

(71) Applicant: LG CHEM, LTD., Seoul (KR)

(72) Inventors: Sujin Kim, Daejeon (KR); Pumsuk Park, Daejeon (KR); Yong Chan Kim, Daejeon (KR); Ki-Hwan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 175 days.

This patent is subject to a terminal disclaimer.

(21) Appl. No.: 15/555,938

(22) PCT Filed: Mar. 16, 2016

(86) PCT No.: PCT/KR2016/002669
§ 371 (c)(1),
(2) Date: Sep. 5, 2017

(87) PCT Pub. No.: WO2016/148514
PCT Pub. Date: Sep. 22, 2016

(65) Prior Publication Data
US 2018/0037004 A1    Feb. 8, 2018

(30) Foreign Application Priority Data

Mar. 16, 2015  (KR) .................. 10-2015-0036112

(51) Int. Cl.
*B32B 15/04*  (2006.01)
*H01B 3/10*  (2006.01)
(Continued)

(52) U.S. Cl.
CPC .............. *B32B 15/04* (2013.01); *H01B 1/02* (2013.01); *H01B 3/10* (2013.01); *H01B 5/14* (2013.01);
(Continued)

(58) Field of Classification Search
CPC .............. B32B 15/04; B32B 2309/105; B32B 2307/418; B32B 2307/412; H01B 1/08; H01B 5/14
See application file for complete search history.

(56) References Cited

U.S. PATENT DOCUMENTS

2004/0258928 A1*  12/2004  Arbab ............... C03C 17/36
428/434
2010/0127611 A1  5/2010  Imura et al.
(Continued)

FOREIGN PATENT DOCUMENTS

CN    101681069 A    3/2010
CN    104246913 A    12/2014
(Continued)

OTHER PUBLICATIONS

Al-Kuhaili: "Optical properties of hafnium oxide thin films and their application in energy-efficient windoes." XP-029186679, Optical Materials, Elsevier, vol. 27, No. 3, Oct. 21, 2004, pp. 383-387. (Year: 2004).*

*Primary Examiner* — Nancy R Johnson
(74) *Attorney, Agent, or Firm* — Dentons US LLP

(57) ABSTRACT

The present specification provides a conductive structure body and an electronic device comprising the same.

14 Claims, 1 Drawing Sheet

(51) Int. Cl.
*H01B 5/14* (2006.01)
*H01B 1/02* (2006.01)
*H01L 31/0224* (2006.01)

(52) U.S. Cl.
CPC ... *B32B 2307/202* (2013.01); *B32B 2307/412* (2013.01); *B32B 2307/418* (2013.01); *B32B 2309/105* (2013.01); *H01L 31/022466* (2013.01)

(56) References Cited

U.S. PATENT DOCUMENTS

| | | |
|---|---|---|
| 2012/0168755 A1 | 7/2012 | Choi |
| 2014/0102764 A1 | 4/2014 | Fujino et al. |
| 2014/0251429 A1 | 9/2014 | Lim et al. |
| 2015/0223326 A1 | 8/2015 | Lim et al. |

FOREIGN PATENT DOCUMENTS

| | | |
|---|---|---|
| KR | 1020090066245 A | 6/2009 |
| KR | 1020120028506 A | 3/2012 |
| KR | 101223487 B1 | 1/2013 |
| KR | 1020140009493 A | 1/2014 |
| KR | 1020140030073 A | 3/2014 |
| WO | WO2009078682 A2 | 6/2009 |

\* cited by examiner

[Figure 1]
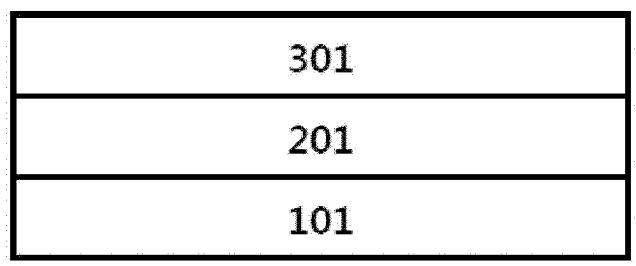
[Figure 2]
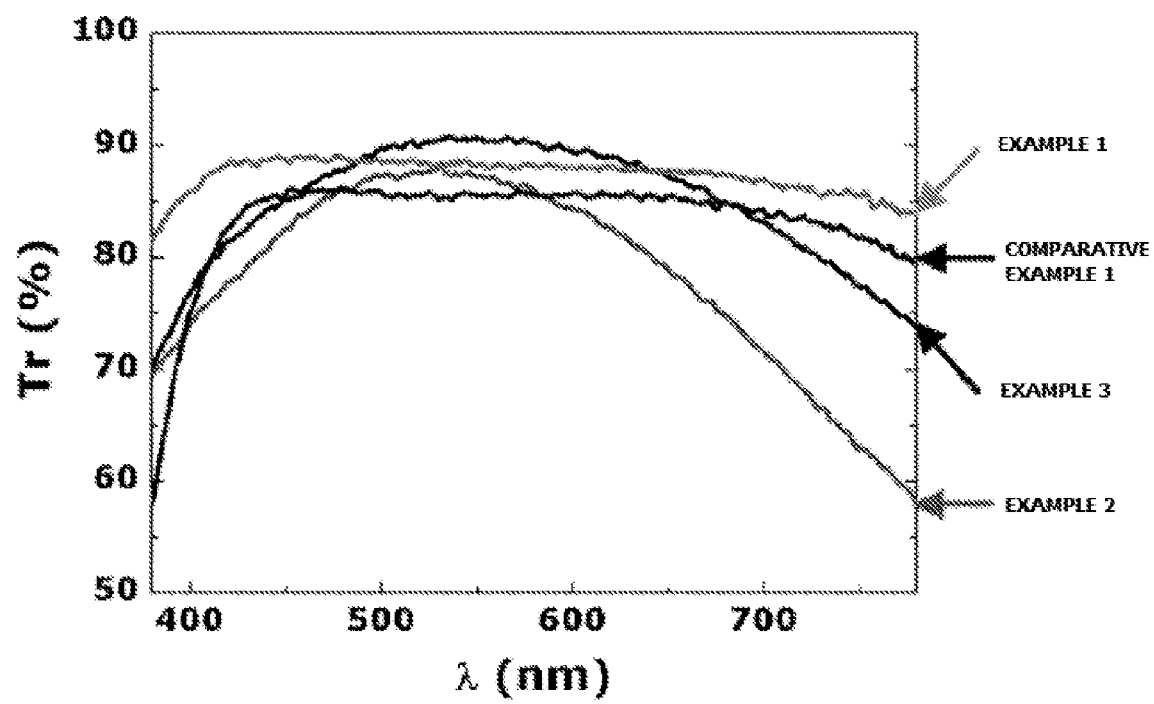

CONDUCTIVE STRUCTURE AND ELECTRONIC DEVICE COMPRISING SAME

This application is a National Stage Application of International Application No. PCT/KR2016/002669, filed Mar. 16, 2016, and claims the benefit of Korean Patent Application No. 10-2015-0036112 filed Mar. 16, 2015, contents of which are incorporated herein by reference in their entirety for all purposes as if fully set forth below.

This application claims priority to and the benefit of Korean Patent Application No. 10-2015-0036112 filed in the Korean Intellectual Property Office on Mar. 16, 2015, the entire contents of which are incorporated herein by reference.

TECHNICAL FIELD

The present specification relates to a conductive structure body and an electronic device comprising the same.

BACKGROUND ART

With sudden emergence of a new renewable energy industry together with a high-tech information technology industry, there is a growing interest in a conductive structure body with both electrical conductivity and light transmission. A conductive structure body in an organic electronic device as a thin transparent substrate needs to transmit light and have excellent electrical conductivity.

As a material of the conductive structure body, transparent conducting oxide (TCO) fabricated in a thin film shape is representative. The transparent conductive oxide which is collectively referred to as an oxide-based degenerated semiconductor electrode having both high optical transmittance (85% or higher) and low specific resistance ($1 \times 10^{-3}$ Ωm) in a visible-ray region is used as core electrode materials for functional thin films such as an antistatic film, an electromagnetic wave shielding film, and the like, a flat panel display, a solar cell, a touch panel, a transparent transistor, a flexible photoelectric device, a transparent photoelectric device, and the like according to a size of the surface resistance.

However, the conductive structure body manufactured using the transparent conductive oxide as a material has a problem that efficiency of the device is lowered due to low electric conductivity.

DETAILED DESCRIPTION OF THE INVENTION

Technical Problem

The present specification has been made in an effort to provide a conductive structure body and an electronic device comprising the same.

Technical Solution

An exemplary embodiment of the present specification provides a conductive structure body comprising: a first dielectric layer comprising a first metal compound; a second dielectric layer comprising a second metal compound provided to face the first dielectric layer comprising the first metal oxide; and a metal layer provided between the first dielectric layer and the second dielectric layer, in which the conductive structure body satisfies Equation 1 given below.

$$\frac{0.12}{D_{\text{eff}}} + \left(1 - 0.06^{k_{\text{eff\_dielectric}}}\right) + \left(1 - 0.98^{(d \cdot k_{\text{eff\_metal}})}\right) \leq 0.25 \quad \text{[Equation 1]}$$

$$D_{\text{eff}} = \frac{n_{\text{eff\_550}} - 1}{n_{\text{eff\_380}} - n_{\text{eff\_450}}} \quad \text{[Equation 2]}$$

$$n_{\text{eff\_dielectric}}^2 = \frac{1}{2}\{(n_1^2 - k_1^2)f_1 + (n_2^2 - k_2^2)f_2\} \times \quad \text{[Equation 3]}$$
$$\left(1 + \left\{1 + \left[\frac{2(n_1 k_1 f_1 + n_2 k_2 f_2)}{(n_1^2 - k_1^2)f_1 + (n_2^2 - k_2^2)f_2}\right]^2\right\}^{1/2}\right)$$

$$k_{\text{eff\_dielectric}} = \frac{1}{n_{\text{eff\_dielectric}}}(n_1 k_1 f_1 + n_2 k_2 f_2) \quad \text{[Equation 4]}$$

$$n_{\text{eff\_metal}}^2 = \frac{1}{2}\{(n_3^2 - k_3^2)f_3 + (n_4^2 - k_4^2)f_4\} \times \quad \text{[Equation 5]}$$
$$\left(1 + \left\{1 + \left[\frac{2(n_3 k_3 f_3 + n_4 k_4 f_4)}{(n_3^2 - k_3^2)f_3 + (n_4^2 - k_4^2)f_4}\right]^2\right\}^{1/2}\right)$$

$$k_{\text{eff\_metal}} = \frac{1}{n_{\text{eff\_metal}}}(n_3 k_3 f_3 + n_4 k_4 f_4) \quad \text{[Equation 6]}$$

In Equation 1, $D_{\text{eff}}$ represents a dispersion of average refractive indexes of the first dielectric layer and the second dielectric layer obtained by Equations 2 and 3, $k_{\text{eff\_dielectric}}$ represents an average light extinction coefficient of the first dielectric layer and the second dielectric layer obtained by Equation 4, d represents a total thickness of the first dielectric layer, the second dielectric layer, and the metal layer, $k_{\text{eff\_metal}}$ represents the average light extinction coefficient of the first dielectric layer, the second dielectric layer, and the metal layer obtained by Equation 5, in Equation 2, $n_{\text{eff\_550}}$ represents the average refractive index of the first dielectric layer and the second dielectric layer obtained by Equation 3 in the light having a wavelength of 550 nm, $n_{\text{eff\_450}}$ represents the average refractive index of the first dielectric layer and the second dielectric layer obtained by the Equation 3 in the light having the wavelength of 450 nm, and $n_{\text{eff\_380}}$ represents the average refractive index of the first dielectric layer and the second dielectric layer obtained by Equation 3 in the light having the wavelength of 380 nm, in Equations 3 and 4, $n_1$ represents a refractive index of the first dielectric layer, $n_2$ represents the refractive index of the second dielectric layer, $k_1$ represents the light extinction coefficient of the first dielectric layer, $k_2$ represents the light extinction coefficient of the second dielectric layer, $f_1$ represents a thickness ratio of the first dielectric layer to the first dielectric layer and the second dielectric layer, and $f_2$ represents the thickness ratio of the second dielectric layer to the first dielectric layer and the second dielectric layer, in Equations 5 and 6, $n_3$ represents an average refractive index $n_{\text{eff\_dielectric}}$ of the first dielectric layer and the second dielectric layer, $n_4$ represents the refractive index of the metal layer, $k_3$ represents the average light extinction coefficient $K_{\text{eff\_dielectric}}$ of the first dielectric layer and the second dielectric layer, $k_4$ represents the light extinction coefficient of the metal layer, $f_3$ represents the thickness ratio of the first dielectric layer and the second dielectric layer to the conductive structure body, and $f_4$ represents the thickness ratio of the metal layer to the conductive structure body, and each of the average light extinction coefficient $k_{\text{eff\_dielectric}}$ of the first dielectric layer and the second dielectric layer and the average light extinction coefficient $k_{\text{eff\_metal}}$ of the first dielectric layer, the second dielectric layer, and the metal layer is a value measured in the light having the wavelength of 380 nm.

Another exemplary embodiment of the present specification provides a transparent electrode comprising the conductive structure body.

Still another exemplary embodiment of the present specification provides an electronic device comprising the conductive structure body.

Advantageous Effects

The conductive structure body according to the embodiment of the present specification has high light transmittance and a low surface resistance value. Further, the conductive structure body according to the embodiment of the present specification has features of a low change in the light transmittance according to a wavelength and particularly, a small change in the light transmittance in a wavelength range of 380 nm to 450 nm. Further, the conductive structure body according to the embodiment of the present specification may implement high light transmittance in a wide wavelength range.

BRIEF DESCRIPTION OF DRAWINGS

FIG. 1 illustrates a laminated structure of a conductive structure body according to an embodiment of the present specification.

FIG. 2 illustrates light transmittance according to a wavelength in conductive structure bodies according to Examples 1 to 3 and Comparative Example 1.

EXPLANATION OF REFERENCE NUMERALS AND SYMBOLS

101: First dielectric layer
201: Metal layer
301: Second dielectric layer

BEST MODE

In this specification, it will be understood that when a member is referred to as being "on" another member, it can be directly on the other member or intervening members may also be present.

Throughout the specification, unless explicitly described to the contrary, the word "comprise" and variations such as "comprises" or "comprising" will be understood to imply the inclusion of stated elements but not the exclusion of any other elements.

Hereinafter, the present specification will be described in more detail.

An exemplary embodiment of the present specification provides a conductive structure body comprising: a first dielectric layer comprising a first metal compound; a second dielectric layer provided to face the first dielectric layer comprising the first metal oxide and comprising a second metal compound; and a metal layer provided between the first dielectric layer and the second dielectric layer and satisfying Equation 1 below.

$$\frac{0.12}{D_{\textit{eff}}} + \left(1 - 0.06^{k_{\textit{eff\_dielectric}}}\right) + \left(1 - 0.98^{(d \cdot k_{\textit{eff\_metal}})}\right) \le 0.25 \quad \text{[Equation 1]}$$

$$D_{\textit{eff}} = \frac{n_{\textit{eff\_550}} - 1}{n_{\textit{eff\_380}} - n_{\textit{eff\_450}}} \quad \text{[Equation 2]}$$

$$n_{\textit{eff\_dielectric}}^2 = \frac{1}{2}\{(n_1^2 - k_1^2)f_1 + (n_2^2 - k_2^2)f_2\} \times \quad \text{[Equation 3]}$$
$$\left(1 + \left\{1 + \left[\frac{2(n_1 k_1 f_1 + n_2 k_2 f_2)}{(n_1^2 - k_1^2)f_1 + (n_2^2 - k_2^2)f_2}\right]^2\right\}^{1/2}\right)$$

$$k_{\textit{eff\_dielectric}} = \frac{1}{n_{\textit{eff\_dielectric}}}(n_1 k_1 f_1 + n_2 k_2 f_2) \quad \text{[Equation 4]}$$

$$n_{\textit{eff\_metal}}^2 = \frac{1}{2}\{(n_3^2 - k_3^2)f_3 + (n_4^2 - k_4^2)f_4\} \times \quad \text{[Equation 5]}$$
$$\left(1 + \left\{1 + \left[\frac{2(n_3 k_3 f_3 + n_4 k_4 f_4)}{(n_3^2 - k_3^2)f_3 + (n_4^2 - k_4^2)f_4}\right]^2\right\}^{1/2}\right)$$

$$k_{\textit{eff\_metal}} = \frac{1}{n_{\textit{eff\_metal}}}(n_3 k_3 f_3 + n_4 k_4 f_4) \quad \text{[Equation 6]}$$

In Equation 1, $D_{\textit{eff}}$ represents a dispersion of average refractive indexes of the first dielectric layer and the second dielectric layer obtained by Equations 2 and 3, $k_{\textit{eff\_dielectric}}$ represents an average light extinction coefficient of the first dielectric layer and the second dielectric layer obtained by Equation 4, d represents a total thickness of the first dielectric layer, the second dielectric layer, and the metal layer, $k_{\textit{eff\_metal}}$ represents the average light extinction coefficient of the first dielectric layer, the second dielectric layer, and the metal layer obtained by Equation 5, in Equation 2, $n_{\textit{eff\_550}}$ represents the average refractive index of the first dielectric layer and the second dielectric layer obtained by Equation 3 in the light having a wavelength of 550 nm, $n_{\textit{eff\_450}}$ represents the average refractive index of the first dielectric layer and the second dielectric layer obtained by the Equation 3 in the light having the wavelength of 450 nm, and $n_{\textit{eff\_380}}$ represents the average refractive index of the first dielectric layer and the second dielectric layer obtained by Equation 3 in the light having the wavelength of 380 nm, in Equations 3 and 4, $n_1$ represents a refractive index of the first dielectric layer, $n_2$ represents the refractive index of the second dielectric layer, $k_1$ represents the light extinction coefficient of the first dielectric layer, $k_2$ represents the light extinction coefficient of the second dielectric layer, $f_1$ represents a thickness ratio of the first dielectric layer to the first dielectric layer and the second dielectric layer, and $f_2$ represents the thickness ratio of the second dielectric layer to the first dielectric layer and the second dielectric layer, in Equations 5 and 6, $n_3$ represents an average refractive index $n_{\textit{eff\_dielectric}}$ of the first dielectric layer and the second dielectric layer, $n_4$ represents the refractive index of the metal layer, $k_3$ represents the average light extinction coefficient $k_{\textit{eff\_dielectric}}$ of the first dielectric layer and the second dielectric layer, $k_4$ represents the light extinction coefficient of the metal layer, $f_3$ represents the thickness ratio of the first dielectric layer and the second dielectric layer to the conductive structure body, and $f_4$ represents the thickness ratio of the metal layer to the conductive structure body, and each of the average light extinction coefficient $k_{\textit{eff\_dielectric}}$ of the first dielectric layer and the second dielectric layer and the average light extinction coefficient $k_{\textit{eff\_metal}}$ of the first dielectric layer, the second dielectric layer, and the metal layer is a value measured in the light having the wavelength of 380 nm.

According to the embodiment of the present specification, Equation 1 means a parameter for manufacturing a conductive structure body which may secure high light transmittance and minimize a change in light transmittance in a visible-ray region having a short wavelength. In detail, factors affecting the change of the transmittance of the conductive structure body and the transmittance are the dispersion of the refractive index of the dielectric layer, a light absorption amount of the dielectric layer, and the light absorption amount of the metal layer, and Equation 1 means a relational expression to acquire an optimal range of the affecting factors.

According to the embodiment of the present specification, the refractive index and the light extinction coefficient of each layer according to Equations 1 to 6 may be values measured through an ellipsometer.

Since a general conductive structure body is very large in change amount of the light transmittance in the wavelength range of 380 nm to 450 nm, there is a problem in that a difference in light transmittance increases depending on the wavelength range. Therefore, the present inventors have found a condition of the conductive structure body which may minimize the change amount of the light transmittance in the wavelength range of 380 nm to 450 nm.

According to the embodiment of the present specification, when a value of Equation 1 is 0.25 or less, there is an advantage in that the conductive structure body is small in change amount of the light transmittance in the wavelength range of 380 nm to 450 nm. In detail, when the value of Equation 1 is 0.25 or less, since the conductive structure body is small in change amount of the light transmittance in the wavelength range of 380 nm to 450 nm, more excellent transparency may be implemented in a wide wavelength range and high visibility may be secured.

According to the embodiment of the present specification, in order to satisfy that the value of Equation 1 is 0.25 or less, the conductive structure body may be applied by considering optical characteristics depending on materials of respective constituent elements of the conductive structure body.

Since the refractive index n≈1/T when an incident angle of light is 0° and the light is incident in the air, the change in transmittance by the difference in refractive index may be expressed by a relation between $D_{\mathit{eff}}$ which is the dispersion of the refractive index and the light transmittance.

According to the embodiment of the present specification, a coefficient of 0.12 of Equation 1 as an experimentally acquired coefficient is a value derived by using the light transmittance in 380 nm, the light transmittance in 450 nm, and the light transmittance in 550 nm of the conductive structure body. Specifically, according to the embodiment of the present specification, the 0.12 coefficient of Equation 1 may be experimentally derived through Equation 7 below.

$$\frac{(1-T_{550})T_{380}T_{450}}{T_{550}} \quad \text{[Equation 7]}$$

In Equation 7, $T_{550}$ represents the light transmittance of the conductive structure body in the light having the wavelength of 550 nm, $T_{450}$ represents the light transmittance of the conductive structure body in the light having the wavelength of 450 nm, and $T_{380}$ represents the light transmittance of the conductive structure body in the light having the wavelength of 380 nm. In detail, the 380 nm wavelength is a lowest wavelength in the visible-ray region, the 450 nm wavelength is a point where the change of visible-ray transmittance is saturated in the conductive structure body, the 550 nm wavelength is a wavelength which is most recognized by eyes of a person among visible rays, and when a result of deriving an optimal value through Equation 7 is 0.12, a conductive structure body showing an excellent characteristic may be manufactured.

According to the embodiment of the present specification, when the coefficient of 0.12 may be established when the change in light transmittance of the conductive structure body is within 30% in the wavelength of 380 nm to 450 nm and the average light transmittance is 70% or more.

According to the embodiment of the present specification, the change in light transmittance by light absorption of each layer of a conductive laminate may be expressed by the light extinction coefficient. In detail, an absorption amount by the light extinction coefficient of each layer may be expressed by an equation given below.

$$e^{-\frac{4\pi k_{\mathit{eff}}}{\lambda} \cdot d}$$

In the above equation, λ represents the wavelength of the light, $k_{\mathit{eff}}$ represents the light extinction coefficient of the corresponding layer, and d represents the thickness of the corresponding layer. The transmittance is changed by the light absorption in each layer of the conductive laminate and the light absorption amount of each layer may be determined by the light extinction coefficient as shown in the equation.

According to the embodiment of the present specification, when a sum of the thicknesses of the first dielectric layer and the second dielectric layer is 40 nm or more and 120 nm or less, the coefficient of 0.06 of Equation 1 is a value to optimize performance of the conductive structure body.

According to the embodiment of the present specification, when the sum of the thicknesses of the first dielectric layer and the second dielectric layer is 40 nm or more and 120 nm or less and the thickness of the metal layer is 5 nm or more and 20 nm or less, the coefficient of 0.98 of Equation 1 is a value to optimize performance of the conductive structure body.

According to the embodiment of the present specification, the dispersion $D_{\mathit{eff}}$ of the average refractive index of the first dielectric layer and the second dielectric layer may be 1.1 or more. In detail, according to the embodiment of the present specification, when the dispersion $D_{\mathit{eff}}$ of the average refractive index of the first dielectric layer and the second dielectric layer is 1.1 or less, the value of Equation 1 is more than 0.25, and as a result, the change amount in light transmittance in the low wavelength will increase.

According to the embodiment of the present specification, the average light extinction coefficient $k_{\mathit{eff\_dielectric}}$ of the first dielectric layer and the second dielectric layer may be 0.1 or less. Specifically, according to the embodiment of the present specification, the average light extinction coefficient $k_{\mathit{eff\_dielectric}}$ of the first dielectric layer and the second dielectric layer may be 0.04 nm or less.

According to the embodiment of the present specification, the average light extinction coefficient $k_{\mathit{eff\_metal}}$ of the first dielectric layer, the second dielectric layer, and the metal layer may be 0.22 or less. In detail, according to the embodiment of the present specification, the average light extinction coefficient $k_{\mathit{eff\_metal}}$ of the first dielectric layer, the second dielectric layer, and the metal layer may be 0.1 or less.

FIG. 1 illustrates a laminated structure of a conductive structure body according to an embodiment of the present specification. Particularly, FIG. 1 illustrates a conductive structure body in which a first dielectric layer 101, a metal layer 201, and a second dielectric layer 301 are sequentially provided.

According to the embodiment of the present specification, a total thickness of the first dielectric layer and the second dielectric layer may be 40 nm or more and 120 nm or less. Specifically, according to the embodiment of the present specification, the total thickness of the first dielectric layer and the second dielectric layer may be 40 nm or more and 110 nm or less.

The first dielectric layer is a high refractive material and may serve to enhance a light transmittance of the multilayered conductive structure body using the metal layer and facilitate deposition of the metal layer.

According to the embodiment of the present specification, a thickness of the first dielectric layer may be 20 nm or more and 70 nm or less. Particularly, according to the embodiment of the present specification, the thickness of the first dielectric layer may be 20 nm or more and 60 nm or less, or 25 nm or more and 55 nm or less.

When the thickness of the first dielectric layer is in the range, there is an advantage in that a transmittance of the conductive structure body having a multilayered thin film form is excellent. Particularly, when the thickness of the first dielectric layer is beyond the range, there is a problem in that the transmittance of the conductive structure body is lowered. Further, when the thickness is beyond the range, a defect ratio of the deposited metal layer may be increased.

According to the embodiment of the present specification, a thickness of the second dielectric layer may be 20 nm or more and 80 nm or less. Particularly, according to the embodiment of the present specification, the thickness of the second dielectric layer may be 20 nm or more and 60 nm or less, or 25 nm or more and 55 nm or less.

When the thickness of the second dielectric layer is in the range, there is an advantage in that the conductive structure body may have excellent electric conductivity and a low resistance value. Particularly, the thickness range of the second dielectric layer is obtained through an optical design and when the thickness is beyond the range, there is a problem in that the light transmittance of the conductive structure body is lowered.

According to the embodiment of the present specification, a thickness of the metal layer may be 5 nm or more and 25 nm or less. Particularly, in the conductive structure body according to the embodiment of the present specification, the thickness of the metal layer may be 7 nm or more and 20 nm or less.

When the thickness of the metal layer is in the range, there is an advantage in that the conductive structure body may have excellent electric conductivity and a low resistance value. Particularly, when the thickness of the metal layer is less than 5 nm, a continuous film is hardly formed and thus there is a problem in that it is difficult to embody low resistance, and when the thickness is more than 20 nm, there is a problem in that the transmittance of the conductive structure body is lowered.

According to the embodiment of the present specification, the metal layer may comprise one or more metals selected from a group consisting of Ag, Pt, Al, Ni, Ti, Cu, Pd, P, Zn, Si, Sn, Cd, Ga, Mn and Co. Particularly, according to the embodiment of the present specification, the metal layer may comprise one or more kinds of metals selected from a group consisting of Ag, Pt and Al. More particularly, according to the embodiment of the present specification, the metal layer may comprise Ag.

Further, according to the embodiment of the present specification, the metal layer may be made of Ag, or Ag and Ag oxide. Particularly, the metal layer may be made of only Ag. Alternatively, in a manufacturing process of the conductive structure body or a process in which the conductive structure body is comprised and used in an electronic device, by contact with air and moisture, some of the Ag oxide may be comprised in the metal layer.

According to the embodiment of the present specification, when the metal layer is made of Ag and Ag oxide, the Ag oxide may be 0.1 wt % or more and 50 wt % of the weight of the metal layer.

The metal layer may serve to embody low resistance of the conductive structure body by the excellent electric conductivity and the low specific resistance.

According to the embodiment of the present specification, the first metal compound and the second metal compound may independently comprise oxides comprising one or more selected from a group consisting of Hf, Nb, Zr, Y, Ta, La, V, Ti, Zn, Ni, B, Si, Al, In and Sn, respectively.

According to the embodiment of the present specification, the conductive structure body further comprises a transparent supporter and the first dielectric layer may be provided on the transparent supporter.

According to the embodiment of the present specification, the transparent supporter may be a glass substrate or a transparent plastic substrate having excellent transparency, surface smoothness, ease of handling, and waterproofness, but is not limited thereto and any substrate which is commonly used in an electronic device is not limited. Specifically, the substrate may be made of glass; a urethane resin; a polyimide resin; a polyester resin; a (meth) acrylate-based polymer resin; and a polyolefin-based resin such as polyethylene or polypropylene.

According to the embodiment of the present specification, the average light transmittance of the conductive structure body may be 70% or more in light having a wavelength of 550 nm. Particularly, according to the embodiment of the present specification, the average light transmittance of the conductive structure body may be 75% or more or 80% or more in light having a wavelength of 550 nm.

According to the embodiment of the present specification, a change amount in the light transmittance of the conductive structure body may be within 40% in a wavelength range of 380 nm to 450 nm. Particularly, according to the embodiment of the present specification, a change amount in the light transmittance of the conductive structure body may be within 30% in a wavelength range of 380 nm to 450 nm.

According to the embodiment of the present specification, a surface resistance value of the conductive structure body may be 20 $\Omega$/sq or less. Specifically, according to the embodiment of the present specification, the surface resistance value of the conductive structure body may be 10 $\Omega$/sq or less.

According to the embodiment of the present specification, a surface resistance value of the conductive structure body may have a value of 0.1 $\Omega$/sq or more and 20 $\Omega$/sq or less. The surface resistance value of the conductive structure body may be determined by the metal layer and the low surface resistance value can be embodied by the thickness range of the metal layer and the thickness range of the second dielectric layer comprising the second metal oxide.

When the conductive structure body is applied to the electronic device by the low surface resistance value, there is an advantage of enhancing efficiency of the electronic device. Furthermore, in spite of the low surface resistance value, there is an advantage of having a high light transmittance.

According to the embodiment of the present specification, the entire thickness of the conductive structure body may be 50 nm or more and 300 nm or less.

An embodiment of the present specification provides a transparent electrode comprising the conductive structure body.

An embodiment of the present specification provides an electronic device comprising the conductive structure body. According to the embodiment of the present specification, the conductive structure body comprised in the electronic device may serve as a transparent electrode.

According to the embodiment of the present specification, the electronic device may be a touch panel, light emitting glass, a light emitting device, a solar cell or a transistor.

The touch panel, the light emitting glass, the light emitting device, the solar cell, and the transistor may be commonly known in the art, and the electrode may be used as the conductive structure body of the present specification.

Hereinafter, the present specification will be described in detail with reference to Examples for a specific description.

EXAMPLE 1

A first dielectric layer was formed by depositing Hf oxide on a glass substrate by using an RF sputter method. A metal layer made of Ag was deposited to a thickness of 10 nm on the first dielectric layer by using a DC sputter method and Nb oxide was deposited on the metal layer as a second dielectric layer to manufacture a conductive structure body.

EXAMPLE 2

A first dielectric layer was formed by depositing Hf oxide on a glass substrate by using an RF sputter method. A metal layer made of Ag was deposited to a thickness of 18 nm on the first dielectric layer by using a DC sputter method and Hf oxide was deposited on the metal layer as a second dielectric layer to manufacture a conductive structure body.

EXAMPLE 3

A first dielectric layer was formed by depositing Hf oxide on a glass substrate by using an RF sputter method. A metal layer made of Ag was deposited to a thickness of 13 nm on the first dielectric layer by using a DC sputter method and Nb oxide was deposited on the metal layer as a second dielectric layer to manufacture a conductive structure body.

COMPARATIVE EXAMPLE 1

A first dielectric layer was formed by depositing Ce oxide on a glass substrate by using an RF sputter method. A metal layer made of Ag was deposited to a thickness of 10 nm on the first dielectric layer by using a DC sputter method and AZO was deposited on the metal layer as a second dielectric layer to manufacture a conductive structure body.

Values of Equation 1 and physical properties according to each configuration of the conductive structure bodies according to Examples 1 to 3 and Comparative Example 1 were illustrated in Table 1 below.

TABLE 1

| | Parameter | | | | Refractive Index | | Thickness | | | Tr (%) | ΔTr (%) (@380 nm to | Surface Resistance |
| | | | | | First Dielectric Layer | Second Dielectric Layer | First Dielectric Layer | Metal Layer | Second Dielectric Layer | | | |
| | Equation 1 | $D_{eff\_dielectric}$ | $k_{eff\_dielectric}$ | $k_{eff\_metal}$ | | | | | | @550 nm | 450 nm) | (Ω/sq) |
| Example 1 | 0.1 | 9.51 | 0.008 | 0.036 | 2.09 | 2.08 | 47 | 10 | 38 | 88.2 | 7.3 | <10 |
| Example 2 | 0.11 | 21.99 | 0 | 0.056 | 2.09 | 2.09 | 40 | 18 | 40 | 87.2 | 13 | <10 |
| Example 3 | 0.12 | 9.51 | 0.008 | 0.045 | 2.09 | 2.08 | 42 | 13 | 40 | 89 | 10.2 | <10 |
| Comparative Example 1 | 0.29 | 3.88 | 0.05 | 0.075 | 2.26 | 1.91 | 28 | 10 | 43 | 85.7 | 27.6 | <10 |

However, the Examples according to the present specification may be modified in various forms, and it is not interpreted that the scope of the present specification is limited to the Examples described in detail below. The Examples of the present specification will be provided for more completely explaining the present specification to those skilled in the art.

FIG. 2 illustrates light transmittances according to a wavelength in the conductive structure bodies according to Examples 1 to 3 and Comparative Example 1.

According to Table 1 and FIG. 2, it can be seen that in the conductive structure body according to the Comparative Example 1 in which Equation 1 is not satisfied, a variation of the light transmittance in a wavelength range of 380 nm to 450 nm is significantly large. On the contrary, in the case of Examples 1 to 3 in which Equation 1 is satisfied, it can be seen that the variation of the light transmittance in a wavelength range of 380 nm to 450 nm is relatively small.

The invention claimed is:
1. A conductive structure body comprising:
   a first dielectric layer comprising a first metal compound;
   a second dielectric layer comprising a second metal compound provided to face the first dielectric layer; and
   a metal layer provided between the first dielectric layer and the second dielectric layer,
   wherein the second metal compound comprises an oxide comprising at least one element selected from a group consisting of Nb, Zr, Y, Ta, La, V, Ti, Zn, Ni, B, Si, Al, In, and Sn,
   wherein an average light transmittance of the conductive structure body is 80% or more for light having a wavelength of 550 nm, and wherein the conductive structure body satisfies Equations 1 to 6 given below:

$$\frac{0.12}{D_{eff}} + \left(1 - 0.06^{k_{eff\_dielectric}}\right) + \left(1 - 0.98^{(d \cdot k_{eff\_metal})}\right) \leq 0.25 \quad \text{[Equation 1]}$$

$$D_{eff} = \frac{n_{eff\_550} - 1}{n_{eff\_380} - n_{eff\_450}} \quad \text{[Equation 2]}$$

$$n^2_{eff\_dielectric} = \frac{1}{2}\{(n_1^2 - k_1^2)f_1 + (n_2^2 - k_2^2)f_2\} \times \left(1 + \left\{1 + \left[\frac{2(n_1k_1f_1 + n_2k_2f_2)}{(n_1^2 - k_1^2)f_1 + (n_2^2 - k_2^2)f_2}\right]^2\right\}^{1/2}\right) \quad \text{[Equation 3]}$$

$$k_{eff\_dielectric} = \frac{1}{n_{eff\_dielectric}}(n_1k_1f_1 + n_2k_2f_2) \quad \text{[Equation 4]}$$

$$n^2_{eff\_metal} = \frac{1}{2}\{(n_3^2 - k_3^2)f_3 + (n_4^2 - k_4^2)f_4\} \times \left(1 + \left\{1 + \left[\frac{2(n_3k_3f_3 + n_4k_4f_4)}{(n_3^2 - k_3^2)f_3 + (n_4^2 - k_4^2)f_4}\right]^2\right\}^{1/2}\right) \quad \text{[Equation 5]}$$

$$k_{eff\_metal} = \frac{1}{n_{eff\_metal}}(n_3k_3f_3 + n_4k_4f_4) \quad \text{[Equation 6]}$$

in Equation 1, $D_{eff}$ represents a dispersion of average refractive indexes of the first dielectric layer and the second dielectric layer obtained by Equations 2 and 3, $k_{eff\_dielectric}$ represents an average light extinction coefficient of the first dielectric layer and the second dielectric layer obtained by Equation 4, d represents a total thickness of the first dielectric layer, the second dielectric layer, and the metal layer, $k_{eff\_metal}$ represents the average light extinction coefficient of the first dielectric layer, the second dielectric layer, and the metal layer obtained by Equation 5, in Equation 2, $n_{eff\_550}$ represents the average refractive index of the first dielectric layer and the second dielectric layer obtained by Equation 3 for light having a wavelength of 550 nm, $n_{eff\_450}$ represents the average refractive index of the first dielectric layer and the second dielectric layer obtained by the Equation 3 for light having a wavelength of 450 nm, and $n_{eff\_380}$ represents the average refractive index of the first dielectric layer and the second dielectric layer obtained by Equation 3 for light having a wavelength of 380 nm, in Equations 3 and 4, $n_1$ represents a refractive index of the first dielectric layer, $n_2$ represents the refractive index of the second dielectric layer, $k_1$ represents the light extinction coefficient of the first dielectric layer, $k_2$ represents the light extinction coefficient of the second dielectric layer, fi represents a thickness ratio of the first dielectric layer to the first dielectric layer and the second dielectric layer, and $f_2$ represents the thickness ratio of the second dielectric layer to the first dielectric layer and the second dielectric layer, in Equations 5 and 6, $n_3$ represents an average refractive index $n_{eff\_dielectric}$ of the first dielectric layer and the second dielectric layer, $n_4$ represents the refractive index of the metal layer, $k_3$ represents the average light extinction coefficient $k_{eff\_dielectric}$ of the first dielectric layer and the second dielectric layer, $k_4$ represents the light extinction coefficient of the metal layer, $f_3$ represents the thickness ratio of the first dielectric layer and the second dielectric layer to the conductive structure body, and $f_4$ represents the thickness ratio of the metal layer to the conductive structure body, and each of the average light extinction coefficient $k_{eff\_dielectric}$ of the first dielectric layer and the second dielectric layer and the average light extinction coefficient $k_{eff\_metal}$ of the first dielectric layer, the second dielectric layer, and the metal layer is a value measured for light having a wavelength of 380 nm.

2. The conductive structure body of claim 1, wherein the dispersion $D_{eff}$ of the average refractive index of the first dielectric layer and the second dielectric layer is 1.1 or more.

3. The conductive structure body of claim 1, wherein the average light extinction coefficient $k_{eff\_dielectric}$ of the first dielectric layer and the second dielectric layer is 0.1 or less.

4. The conductive structure body of claim 1, wherein the average light extinction coefficient $k_{eff\_metal}$ of the first dielectric layer, the second dielectric layer, and the metal layer is 0.22 or less.

5. The conductive structure body of claim 1, wherein the total thickness of the first dielectric layer and the second dielectric layer is 40 nm or more and 120 nm or less.

6. The conductive structure body of claim 1, wherein the thickness of the metal layer is in the range of 5 nm or more and 25 nm or less.

7. The conductive structure body of claim 1, wherein the metal layer comprises at least one metal selected from a group consisting of Ag, Pt, Al, Ni, Ti, Cu, Pd, P, Zn, Si, Sn, Cd, Ga, Mn, and Co.

8. The conductive structure body of claim 1, wherein the first metal compound comprises an oxide comprising at least one element selected from a group consisting of Hf, Nb, Zr, Y, Ta, La, V, Ti, Zn, Ni, B, Si, Al, In, and Sn.

9. The conductive structure body of claim 1, further comprising:
a transparent supporter,
wherein the first dielectric layer is provided on the transparent supporter.

10. The conductive structure body of claim 1, wherein a change amount in light transmittance of the conductive structure body is 40% or less for light having a wavelength range of 380 nm to 450 nm.

11. The conductive structure body of claim 1, wherein a surface resistance value of the conductive structure body is 20 Ω/sq or less.

12. A transparent electrode comprising the conductive structure body of claim 1.

13. An electronic device comprising the conductive structure body of claim 1.

14. The conductive structure body of claim 1, wherein the conductive structure body satisfies Equation 1 below:

$$0.12/D_{eff} + (1 - 0.06^{k_{eff\_dielectric}}) + (1 - 0.98^{(d \cdot k_{eff\_metal})}) \leq 0.12. \quad \text{[Equation 1]}$$

* * * * *